(12) United States Patent
Nelson et al.

(10) Patent No.: US 8,907,276 B2
(45) Date of Patent: Dec. 9, 2014

(54) MEASURING THE POPULATIONS IN EACH HYPERFINE GROUND STATE OF ALKALI ATOMS IN A VAPOR CELL WHILE LIMITING THE CONTRIBUTION OF THE BACKGROUND VAPOR

(71) Applicant: Honeywell International, Inc., Morristown, NJ (US)

(72) Inventors: Karl D. Nelson, Plymouth, MN (US); Kenneth Salit, Plymouth, MN (US); Ben Luey, Denver, CO (US); Mike Anderson, Denver, CO (US)

(73) Assignee: Honeywell International Inc., Morristown, NJ (US)

( * ) Notice: Subject to any disclaimer, the term of this patent is extended or adjusted under 35 U.S.C. 154(b) by 72 days.

(21) Appl. No.: 13/759,400

(22) Filed: Feb. 5, 2013

(65) Prior Publication Data
US 2013/0270434 A1    Oct. 17, 2013

Related U.S. Application Data

(60) Provisional application No. 61/622,719, filed on Apr. 11, 2012.

(51) Int. Cl.
*G04F 5/14* (2006.01)
*H03B 17/00* (2006.01)
*H01J 49/46* (2006.01)

(52) U.S. Cl.
CPC .............. *H01J 49/46* (2013.01); *H03B 17/00* (2013.01); *G04F 5/14* (2013.01)
USPC .......................................................... 250/305

(58) Field of Classification Search
CPC ............. H01J 49/46; G04F 5/14; H03B 17/00
USPC .......................................................... 250/305
See application file for complete search history.

(56) References Cited

U.S. PATENT DOCUMENTS

| 5,338,930 | A | * | 8/1994 | Chu et al. ....................... 250/251 |
| 5,420,549 | A | * | 5/1995 | Prestage ......................... 331/94.1 |
| 5,528,028 | A | * | 6/1996 | Chu et al. ........................ 250/251 |
| 5,606,291 | A | | 2/1997 | Verbanets |
| 5,657,340 | A | * | 8/1997 | Camparo et al. ................ 372/69 |
| 5,852,386 | A | | 12/1998 | Chantry et al. |
| 6,762,869 | B2 | | 7/2004 | Maleki et al. |
| 6,919,770 | B2 | | 7/2005 | Happer et al. |
| 7,102,451 | B2 | | 9/2006 | Happer et al. |

(Continued)

*Primary Examiner* — Phillip A Johnston
*Assistant Examiner* — Sean Luck
(74) *Attorney, Agent, or Firm* — Fogg & Powers LLC

(57) ABSTRACT

A method for measuring the population of atoms in a vapor cell comprises collecting a sample of atoms, applying radio frequency (RF) spectroscopy to the sample such that a first portion of the atoms are in an upper ground state and a second portion of the atoms are in a lower ground state, and applying light to the sample to produce a first fluorescence such that all atoms are left in the lower ground state. The method further comprises measuring a population of the atoms in the upper ground state based on the first fluorescence, applying an RF pulse to the sample to transfer the atoms in the lower ground state to the upper ground state, and applying light to the sample after the RF pulse is applied to produce a second fluorescence. A population of all the atoms in the sample is then measured based on the second fluorescence.

13 Claims, 2 Drawing Sheets

(56) References Cited

U.S. PATENT DOCUMENTS

| | | |
|---|---|---|
| 7,323,941 B1 | 1/2008 | Happer et al. |
| 7,778,293 B2 | 8/2010 | Vanier |
| 7,852,163 B2 | 12/2010 | Braun et al. |
| 7,859,350 B1 * | 12/2010 | Schwindt et al. ............ 331/94.1 |
| 7,944,317 B2 | 5/2011 | Strabley et al. |
| 7,965,147 B2 | 6/2011 | Strabley et al. |
| 8,009,520 B2 | 8/2011 | Jau et al. |
| 2009/0058545 A1 * | 3/2009 | Prestage et al. ............... 331/94.1 |
| 2010/0033256 A1 * | 2/2010 | Strabley et al. ............... 331/94.1 |
| 2013/0003059 A1 | 1/2013 | Salit et al. |
| 2013/0265112 A1 | 10/2013 | Strabley et al. |

* cited by examiner

MEASURING THE POPULATIONS IN EACH HYPERFINE GROUND STATE OF ALKALI ATOMS IN A VAPOR CELL WHILE LIMITING THE CONTRIBUTION OF THE BACKGROUND VAPOR

This application claims the benefit of priority to U.S. Provisional Application No. 61/622,719, filed on Apr. 11, 2012, which is incorporated by reference.

STATEMENT REGARDING FEDERALLY SPONSORED RESEARCH OR DEVELOPMENT

This invention was made with Government support under Government Contract No. W31P4Q-09-C-0348 awarded by DARPA. The Government has certain rights in the invention.

BACKGROUND

Measurement of the internal state of alkali atoms in an atomic clock is typically done using resonance fluorescence. To distinguish between the upper and lower ground states of the atoms, the atoms are probed with light on resonance with the upper ground state but not the lower ground state. Next, an optical repumping step transfers the lower state population to the upper state and the same resonance is used to probe the atoms again. At this point, the fluorescence signal contains a contribution from all of the atoms. If the sample of atoms to be measured is captured from hot vapor in a vapor cell, problems occur when the repumping step repumps all the atoms in the background vapor as well, increasing the overall light level in the second probe, and reducing the size of the signal compared to the background.

SUMMARY

A method for measuring the population of atoms in a vapor cell comprises collecting a sample of atoms from the vapor cell, applying radio frequency (RF) spectroscopy to the sample of atoms such that a first portion of the atoms are in an upper ground state and a second portion of the atoms are in a lower ground state, and applying light to the sample of atoms to produce a first fluorescence of the atoms such that all the atoms in the sample are left in the lower ground state. The method further comprises measuring a population of the atoms in the upper ground state based on the first fluorescence of the atoms, applying an RF pulse to the sample of atoms to transfer the atoms in the lower ground state to the upper ground state, and applying light to the sample of atoms after the RF pulse is applied to produce a second fluorescence of the atoms. A population of all the atoms in the sample is then measured based on the second fluorescence of the atoms.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
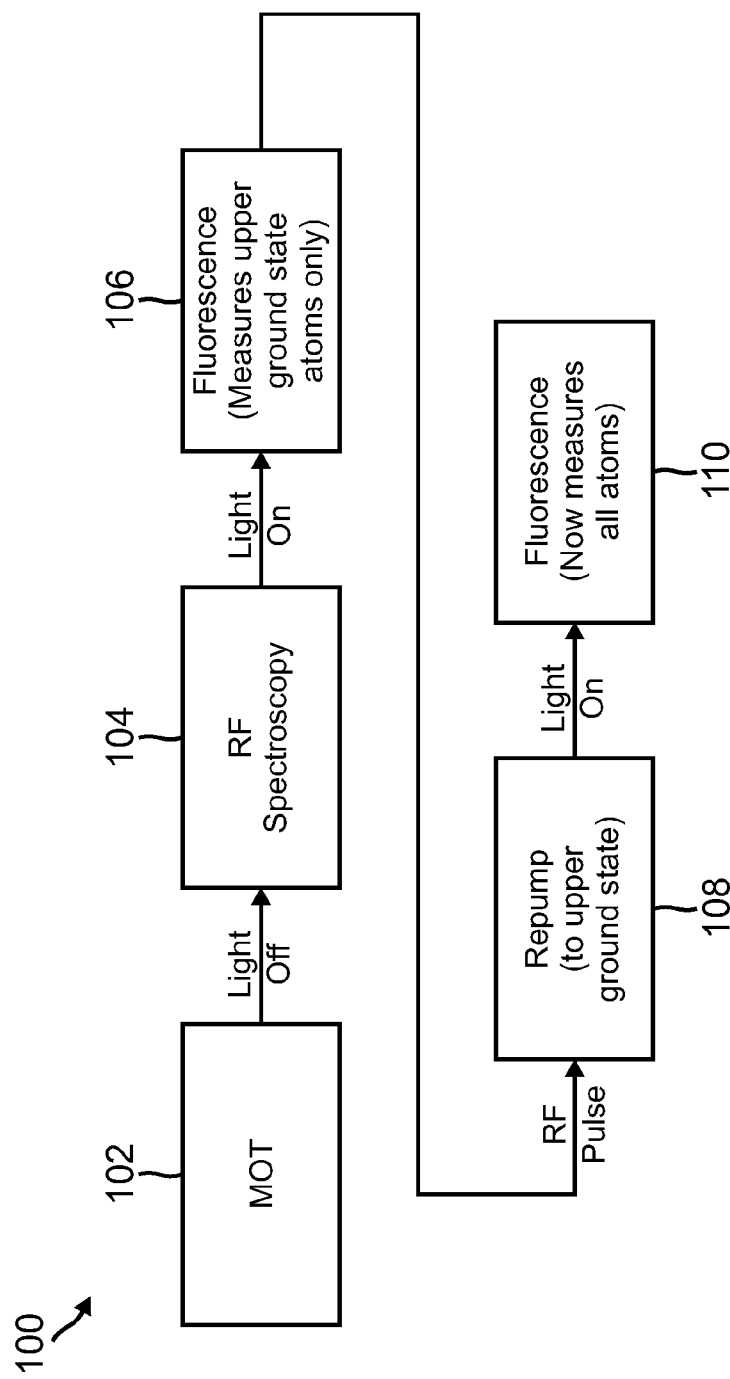
FIG. 1 is a flow diagram of a process for radio frequency (RF) repumping of atoms in a vapor cell according to one embodiment.

In the following detailed description, reference is made to the accompanying drawings that form a part hereof, and in which is shown by way of illustration specific illustrative embodiments. It is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

A method is provided for measuring the population of alkali atoms in each hyperfine ground state in a vapor cell while limiting the contribution of the background vapor. The method generally comprises collecting a sample of atoms, and applying radio frequency (RF) spectroscopy to the sample of atoms such that a first portion of the atoms are in an upper ground state and a second portion of the atoms are in a lower ground state. Light is applied to the sample of atoms to produce a first fluorescence of the atoms such that all the atoms are left in the lower ground state, and a population of the atoms in the upper ground state is measured based on the first fluorescence of the atoms. An RF pulse is applied to the sample of atoms to transfer the atoms in the lower ground state to the upper ground state. Light is applied to the sample of atoms after the RF pulse is applied to produce a second fluorescence of the atoms, and a population of all the atoms in the sample is measured based on the second fluorescence of the atoms.

The present method utilizes a coherent transfer of atoms in the vapor cell from lower ground states to upper ground states using the RF pulse. At the same time, atoms in the upper ground state go to the lower ground state. Since a cold atom sample can be prepared entirely in the lower state, the present method ensures that the entire sample is repumped. Meanwhile, the atoms in the background vapor are in a random state so the RF pulse has no effect on the net populations of those atoms.

The present technique can be implemented in an atomic clock used as a primary frequency standard, for example. An exemplary atomic clock is disclosed in U.S. Pat. No. 7,944,317, entitled COLD ATOM MICRO PRIMARY STANDARD, the disclosure of which is incorporated by reference herein.

FIG. 1 is flow diagram of a process 100 for radio frequency (RF) repumping of atoms in a vapor cell according to one embodiment. Initially, a magneto-optic trap (MOT) 102 collects a sample of cold atoms. The MOT 102 can be part of the physics package of an atomic clock, for example. A laser light is turned off, and the sample of atoms is subjected to RF spectroscopy (block 104). This results in some of the atoms being in the upper ground state and some of the atoms being in the lower ground state. Light is then applied to the sample of atoms, and the fluorescence of the atoms is used to measure the population of atoms in the upper ground state only (block 106). The light is applied until all atoms have been optically pumped to the lower ground state. Next, an RF pulse is applied to the sample of atoms to "repump" the atoms from the lower ground state to the upper ground state (block 108). Finally, light is applied again to the sample of atoms and the fluorescence of the atoms is used to measure the population of all the atoms in the sample (block 110).

Figure 2:
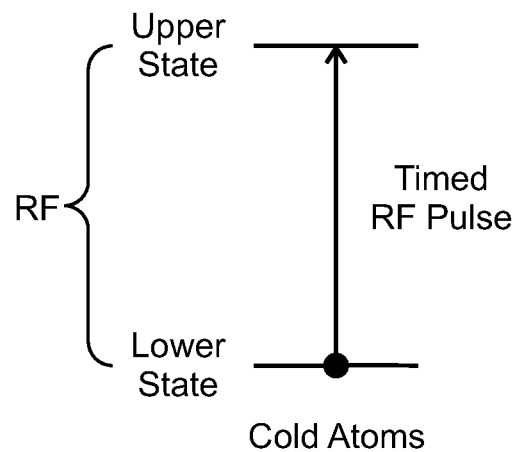
FIG. 2 is an energy level diagram for the cold atoms in a vapor cell subjected to the RF repumping process shown in FIG. 1.

FIG. 2 is an energy level diagram for the cold atoms in a vapor cell subjected to RF repumping according to the present technique. As shown in FIG. 2, the cold atoms in the sample are all in the lower ground state when a timed RF pulse is applied. The arrow represents the coherent transfer of atoms to the upper ground state by the RF radiation.

Figure 3:
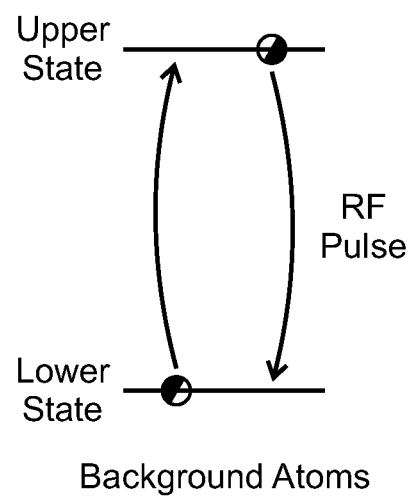
FIG. 3 is an energy level diagram for the background atoms in a vapor cell subjected to the RF repumping process shown in FIG. 1.

FIG. 3 is an energy level diagram for the background atoms in a vapor cell subjected to the RF repumping of the present technique. Initially, the atoms of the background vapor are randomly in the upper ground state or the lower ground state (about one-half in each state, represented by half-filled circles). The RF pulse swaps the upper and lower ground states of the background atoms, represented by arrows in both directions in FIG. 3. The resulting distribution of the ground states is about the same as before the RF pulse. This is in contrast to conventional optical repumping, which transfers all atoms to the upper ground state regardless of the initial conditions.

In one embodiment, using optical repumping and an RF source, the Rabi frequency of the atoms in a vapor cell is measured to provide an initial calibration. This initial calibration is used to determine the power and time needed for the timed RF pulse (block 108 of FIG. 1 and FIG. 2) and need only be done once. A sample of atoms from the vapor cell is trapped and cooled using a magneto-optic trap. Light is applied on the cycling transition long enough to pump all atoms to the lower ground state. Then, the cold atoms are prepared in a superposition or mixture of upper and lower hyperfine ground states. This is the state which is to be measured by the present technique. To make the measurement, light is applied on the cycling transition and fluorescence is recorded. The fluorescence is proportional to the population in the upper ground state. Light is applied until all atoms have been optically pumped to the lower ground state. The light on the cycling transition is then extinguished, either by removing the light or by changing the frequency of the light far from resonance. Next, an RF pi pulse is applied using the measured Rabi frequency. The cold atoms are all transferred from the lower ground state to the upper ground state. Finally, light is applied again on the cycling transition and the fluorescence is recorded. The fluorescence from nearby atoms that were not part of the cold sample is much less than if there had been optical repumping, increasing the signal-to-noise ratio.

Example Embodiments

Example 1 includes a method for measuring the population of atoms in a vapor cell, the method comprising collecting a sample of atoms from the vapor cell; applying radio frequency (RF) spectroscopy to the sample of atoms such that a first portion of the atoms are in an upper ground state and a second portion of the atoms are in a lower ground state; applying light to the sample of atoms to produce a first fluorescence of the atoms such that all the atoms in the sample are left in the lower ground state; measuring a population of the atoms in the upper ground state based on the first fluorescence of the atoms; applying an RF pulse to the sample of atoms to transfer the atoms in the lower ground state to the upper ground state; applying light to the sample of atoms after the RF pulse is applied to produce a second fluorescence of the atoms; and measuring a population of all the atoms in the sample based on the second fluorescence of the atoms.

Example 2 includes the method of Example 1, wherein the sample of atoms is collected in a magneto-optic trap.

Example 3 includes the method of Example 2, wherein the magneto-optic trap is part of a physics package in an atomic clock.

Example 4 includes the method of any of Examples 1-3, wherein the light is from a laser.

Example 5 includes the method of any of Examples 1-4, further comprising measuring a Rabi frequency of the sample of atoms from the vapor cell to provide an initial calibration.

Example 6 includes the method of any of Examples 1-5, wherein the light applied to the sample of atoms to produce the first fluorescence is applied on a cycling transition long enough to pump all the atoms in the sample to the lower ground state.

Example 7 includes the method of any of Examples 1-6, wherein the first fluorescence is proportional to the population of the atoms in the upper ground state.

Example 8 includes the method of any of Examples 1-7, wherein the light applied to the sample of atoms to produce the second fluorescence is applied on the cycling transition.

Example 9 includes a method for measuring the population of atoms in a vapor cell, the method comprising collecting a sample of atoms from the vapor cell in a magneto-optic trap; measuring a Rabi frequency of the sample of atoms from the vapor cell to provide an initial calibration; applying RF spectroscopy to the sample of atoms such that a first portion of the atoms are in an upper ground state and a second portion of the atoms are in a lower ground state; applying laser light to the sample of atoms to produce a first fluorescence of the atoms such that all the atoms in the sample are left in the lower ground state; measuring a population of the atoms in the upper ground state based on the first fluorescence of the atoms; applying an RF pulse to the sample of atoms to transfer the atoms in the lower ground state to the upper ground state; applying laser light to the sample of atoms after the RF pulse is applied to produce a second fluorescence of the atoms; and measuring a population of all the atoms in the sample based on the second fluorescence of the atoms.

Example 10 includes the method of Example 9, wherein the magneto-optic trap is part of a physics package in an atomic clock.

Example 11 includes the method of any of Examples 9-10, wherein the laser light applied to the sample of atoms to produce the first fluorescence is applied on a cycling transition long enough to pump all the atoms in the sample to the lower ground state.

Example 12 includes the method of any of Examples 9-11, wherein the first fluorescence is proportional to the population of the atoms in the upper ground state.

Example 13 includes the method of any of Examples 9-12, wherein the laser light applied to the sample of atoms to produce the second fluorescence is applied on the cycling transition.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method for measuring the population of atoms in a vapor cell, the method comprising:
    collecting a sample of atoms from the vapor cell;
    applying radio frequency (RF) spectroscopy to the sample of atoms during a first time period such that a first portion of the atoms are in an upper ground state and a second portion of the atoms are in a lower ground state;

applying light to the sample of atoms after the RF spectroscopy is applied to produce a first fluorescence of the atoms such that the atoms in the sample are left in the lower ground state;

measuring a population of the atoms in the upper ground state based on the first fluorescence of the atoms;

applying a timed RF pulse to the sample of atoms during a second time period to transfer the atoms in the sample that are left in the lower ground state to the upper ground state, wherein there is a third time period, between the first time period and the second time period, during which an RF field is not applied;

applying light to the sample of atoms after the timed RF pulse is applied to produce a second fluorescence of the atoms; and measuring a population of the atoms in the sample based on the second fluorescence of the atoms.

2. The method of claim 1, wherein the sample of atoms is collected in a magneto-optic trap.

3. The method of claim 2, wherein the magneto-optic trap is part of a physics package in an atomic clock.

4. The method of claim 1, wherein the light is from a laser.

5. The method of claim 1, further comprising measuring a Rabi frequency of the sample of atoms from the vapor cell to provide an initial calibration.

6. The method of claim 1, wherein the light applied to the sample of atoms to produce the first fluorescence is applied on a cycling transition long enough to pump all the atoms in the sample to the lower ground state.

7. The method of claim 6, wherein the first fluorescence is proportional to the population of the atoms in the upper ground state.

8. The method of claim 6, wherein the light applied to the sample of atoms to produce the second fluorescence is applied on the cycling transition.

9. A method for measuring the population of atoms in a vapor cell, the method comprising:

collecting a sample of atoms from the vapor cell in a magneto-optic trap;

measuring a Rabi frequency of the sample of atoms from the vapor cell to provide an initial calibration;

applying radio frequency (RF) spectroscopy to the sample of atoms during a first time period such that a first portion of the atoms are in an upper ground state and a second portion of the atoms are in a lower ground state;

applying laser light to the sample of atoms after the RF spectroscopy is applied to produce a first fluorescence of the atoms such that the atoms in the sample are left in the lower ground state;

measuring a population of the atoms in the upper ground state based on the first fluorescence of the atoms;

applying a timed RF pulse to the sample of atoms during a second time period to transfer the atoms in the sample that are left in the lower ground state to the upper ground state, wherein there is a third time period, between the first time period and the second time period, during which an RF field is not applied;

applying laser light to the sample of atoms after the timed RF pulse is applied to produce a second fluorescence of the atoms; and measuring a population of the atoms in the sample based on the second fluorescence of the atoms.

10. The method of claim 9, wherein the magneto-optic trap is part of a physics package in an atomic clock.

11. The method of claim 9, wherein the laser light applied to the sample of atoms to produce the first fluorescence is applied on a cycling transition long enough to pump all the atoms in the sample to the lower ground state.

12. The method of claim 11, wherein the first fluorescence is proportional to the population of the atoms in the upper ground state.

13. The method of claim 11, wherein the laser light applied to the sample of atoms to produce the second fluorescence is applied on the cycling transition.

* * * * *